United States Patent
Farr et al.

(10) Patent No.: US 9,726,721 B2
(45) Date of Patent: Aug. 8, 2017

(54) OSCILLATION-BASED SYSTEMS AND METHODS FOR TESTING RFID STRAPS

(71) Applicant: Avery Dennison Retail Information Services, LLC, Mentor, OH (US)

(72) Inventors: Adrian N. Farr, Essex (GB); Ian James Forster, Essex (GB)

(73) Assignee: AVERY DENNISON RETAIL INFORMATION SERVICES, LLC, Westborough, MA (US)

( * ) Notice: Subject to any disclaimer, the term of this patent is extended or adjusted under 35 U.S.C. 154(b) by 185 days.

(21) Appl. No.: 14/584,612

(22) Filed: Dec. 29, 2014

(65) Prior Publication Data

US 2016/0003899 A1   Jan. 7, 2016

Related U.S. Application Data

(60) Provisional application No. 62/019,943, filed on Jul. 2, 2014.

(51) Int. Cl.
| | | |
|---|---|---|
| *G01R 31/28* | (2006.01) | |
| *G01R 27/26* | (2006.01) | |
| *G01R 23/02* | (2006.01) | |

(52) U.S. Cl.
CPC ..... *G01R 31/2894* (2013.01); *G01R 27/2605* (2013.01); *G01R 31/2822* (2013.01); *G01R 23/02* (2013.01)

(58) Field of Classification Search
CPC . G01R 31/2894; G01R 31/2893; G01R 31/01
See application file for complete search history.

(56) References Cited

U.S. PATENT DOCUMENTS

| | | | |
|---|---|---|---|
| 6,107,920 A | 8/2000 | Eberhardt et al. | |
| 6,206,292 B1 | 3/2001 | Robertz et al. | |
| 6,262,692 B1 | 7/2001 | Babb | |
| 7,659,822 B2* | 2/2010 | Carrender | G01R 31/2822 235/438 |
| 2004/0212500 A1* | 10/2004 | Stilp | G08B 19/005 340/541 |
| 2005/0138499 A1* | 6/2005 | Pileggi | G01R 31/2884 714/724 |

(Continued)

*Primary Examiner* — Jermele M Hollington
*Assistant Examiner* — Alvaro Fortich
(74) *Attorney, Agent, or Firm* — Avery Dennison Retail Information Services, LLC

(57) ABSTRACT

Systems and methods are provided for testing remote frequency identification (RFID) straps. A testing system includes an amplifier electrically coupled to an inductor or inductive component. The system further includes a pair of contact points to be placed in contact with a pair of contact pads of an RFID strap. Connecting the contact points and the contact pads places the RFID strap in parallel with the inductor to define a resonant circuit. The characteristics of the resonant circuit as an oscillator depend at least in part on the capacitance and the resistance of the RFID strap. As such, the characteristics of the resonant circuit as an oscillator may be monitored to determine the capacitance and/or the resistance of the RFID strap. One or more characteristics of the RFID strap may be compared to one or more threshold values to determine whether the RFID strap is acceptable or defective.

16 Claims, 4 Drawing Sheets

(56) References Cited

U.S. PATENT DOCUMENTS

| | | | | |
|---|---|---|---|---|
| 2005/0280512 A1* | 12/2005 | Forster | ................ | G06K 7/0008 340/10.34 |
| 2006/0226983 A1* | 10/2006 | Forster | ................ | G01R 31/312 340/572.1 |
| 2006/0250246 A1* | 11/2006 | Forster | ................ | G06K 7/0008 340/572.1 |
| 2008/0197193 A1* | 8/2008 | Overhultz | .............. | G06Q 10/02 235/383 |
| 2009/0207022 A1* | 8/2009 | Reckeweg | ........... | G06K 7/0008 340/572.1 |
| 2009/0303035 A1* | 12/2009 | Kirtley, Jr. | ............ | B66F 9/0755 340/539.11 |
| 2013/0207732 A1* | 8/2013 | Cabanillas | | |

* cited by examiner

OSCILLATION-BASED SYSTEMS AND METHODS FOR TESTING RFID STRAPS

CROSS-REFERENCE TO RELATED APPLICATION(S)

The present application claims priority from U.S. Provisional Application No. 62/019,943 filed Jul. 2, 2014, which is incorporated herein by reference in its entirety.

BACKGROUND

Field of the Disclosure

The present subject matter relates to radio frequency identification ("RFID") devices. More particularly, the present subject matter relates to systems and methods for testing RFID straps using an oscillator.

Description of Related Art

RFID tags and labels (collectively referred to herein as "devices") are widely used to associate an object with an identification code. RFID devices generally have a combination of antennae and analog and/or digital electronics, which may include, for example, communications electronics, data memory, and control logic. For example, RFID tags are used in conjunction with security locks in cars, for access control to buildings, and for tracking inventory and parcels. Some examples of RFID tags and labels appear in U.S. Pat. Nos. 6,107,920; 6,206,292; and 6,262,692, all of which are hereby incorporated herein by reference in their entireties.

One difficulty associated with RFID devices is the need to test operation of such devices as part of the manufacturing or fabrication process. In fabrication of RFID devices, the devices may be formed on a sheet or roll or web of material, closely spaced apart. In traditional methods of activating, reading, and/or detecting RFID devices, an antenna is used to send radio frequency ("RE") fields over a relatively long range, that is, over intervening free space. When such methods are applied to testing closely spaced RFID devices, it is difficult to test a single RFID device, since the RF field interacts with several devices simultaneously, and the various RFID devices may interact with one another.

According to other known test methods, an RFID device is integrated into a bridge or other structure, with parameters such as voltage and current being monitored against time. However, such methods are not well-suited to characterization of high frequency parameters, such as the input of an RFID chip, or with a capacitance on the order of 1 pF, or at frequencies between approximately 700 MHz and 1 GHz. Still other test methods involve making a frequency selective network that incorporates an RFID device and then determining the resonant frequency by sweeping a known source across a band, but such methods may be relatively slow (e.g., on the order of milliseconds).

SUMMARY

There are several aspects of the present subject matter which may be embodied separately or together in the devices and systems described and claimed below. These aspects may be employed alone or in combination with other aspects of the subject matter described herein, and the description of these aspects together is not intended to preclude the use of these aspects separately or the claiming of such aspects separately or in different combinations as may be set forth in the claims appended hereto.

In one aspect, an embodiment of a system for testing an RFID strap of the type having a pair of contact pads includes an amplifier and a tuning component such as an inductor or inductive component electrically coupled to the amplifier. This system also includes a pair of contact points configured to be placed in contact with the contact pads of the RFID strap so as to connect the RFID strap to the tuning component to define a resonant circuit. Certain measurable characteristics of the oscillator depend on the capacitance and the resistance of the RFID strap; these characteristics oscillator may be monitored to determine the capacitance and/or the resistance of the RFID strap.

In another aspect, an embodiment of a method is provided for testing an RFID strap. An amplifier electrically coupled to an RFID strap and tuning component such as an inductor or inductive component to define a resonant circuit. Energy is caused to oscillate between the inductor and the RFID strap at the resonant frequency of the resonant circuit. The characteristics of the resonant circuit as an oscillator are monitored to determine the capacitance and/or the resistance of the RFID strap.

DESCRIPTION OF THE ILLUSTRATED EMBODIMENTS

As required, detailed embodiments of the present invention are disclosed herein; however, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

Figure 1:
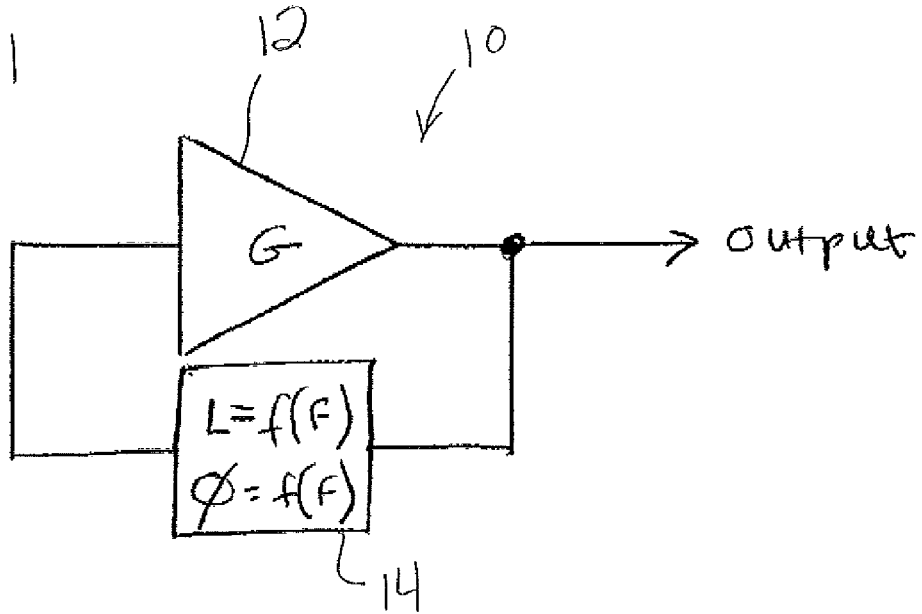
FIG. 1 is a diagrammatic view of an oscillator incorporating a transmission amplifier.
Figure 2:
FIG. 2 is a diagrammatic view of an oscillator incorporating a reflection amplifier.

According to an aspect of the present disclosure, an RFID strap may be quickly tested (e.g., on the order of one microsecond) by incorporating the RFID strap into a resonant circuit in which energy oscillates between an inductive and capacitive component at a resonant frequency. Such a system may be referred to herein as an "oscillator." FIGS. 1 and 2 illustrate two basic forms of an oscillator. In the embodiment of FIG. 1, an oscillator 10 includes an amplifier 12 taking the form of a transmission amplifier. The amplifier 12 is provided with positive feedback via an associated frequency selective network 14. The frequency selective network 14 incorporates complementary inductive and capacitive components and exhibits some form of resonance. As used herein, the term "resonance" refers to a condition in which, at a given frequency, the capacitive impedance and the inductive impedance are equal and opposite, such that the impedance becomes a resistance, which is a composite of all of the energy losses associated with the components of the resonant circuit. As shown in FIG. 1, the frequency selective network 14 of this embodiment may have defined loss/frequency and phase frequency characteristics.

In the embodiment of FIG. 2, an oscillator 16 includes an amplifier 18 taking the form of a reflection amplifier. Reflective feedback is provided to the amplifier 18 by a frequency selective network 20. As in the embodiment of FIG. 1, the frequency selective network 20 incorporates inductive and capacitive elements and exhibits some form of resonance. As shown in FIG. 2, the frequency selective network 20 may have defined resistance/frequency and phase frequency characteristics. In either embodiment of FIG. 1 or FIG. 2, the oscillator 12, 18 may include additional components, such as one or more semiconductor devices (e.g., transistors, diodes with a negative resistance characteristic, and/or integrated circuits that incorporate multiple transistors in a single structure).

Figure 3:
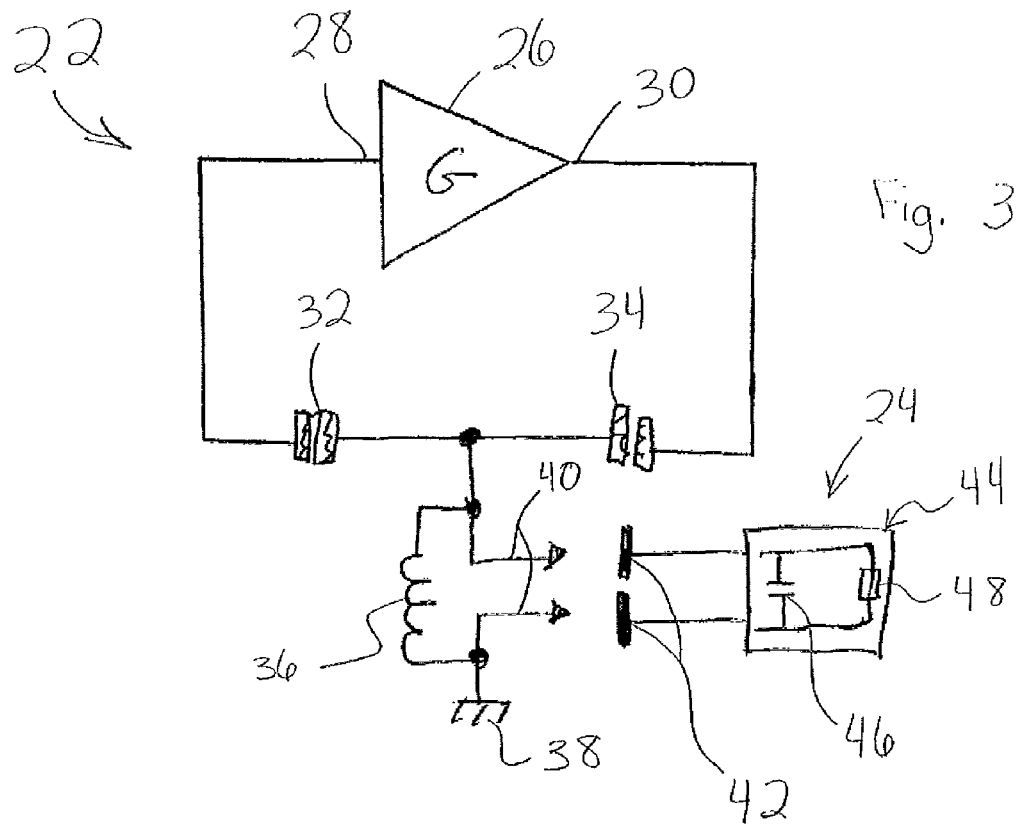
FIG. 3 is a diagrammatic view of a transmission amplifier-based system for testing an RFID strap.

FIG. 3 illustrates a transmission amplifier-based oscillation system 22 (comparable to the oscillator 10 of FIG. 1) for testing an RFID strap 24. The system 22 of this embodiment includes a transmission amplifier 26 having an input side 28 and an output side 30. The input and output sides 28 and 30 of the amplifier 26 are each electrically coupled to a capacitive coupling, such as a capacitor 32 associated with the input side 28 and a capacitor 34 associated with the output side 30. An inductor or inductive component 36 is electrically coupled to the two capacitors 32 and 34 and grounded at 38. The inductor 36 may take any of a number of forms, such as being provided as a coil (flat or in the form of a solenoid structure), a transmission line (e.g., a coaxial line, microstrip line, stripline, or coplanar waveguide), or a self-resonant structure operating at a frequency at which its net impedance is inductive (e.g., a crystal, surface acoustic wave device, or ceramic resonator).

The system 22 of FIG. 3 further includes a pair of connection points 40 electrically coupled to opposite ends of the inductor 36. The connection points 40 are configured to be placed into contact with a pair of contact pads 42 of an RFID strap 24, thereby placing the RFID strap 24 in parallel with the inductor 36. An RFID chip 44 is electrically coupled to the two contact pads 42, with FIG. 3 showing a simplified structure of an exemplary RFID chip 44. The RFID chip 44 of FIG. 3 includes a capacitor 46 and a resistor 48 connected in parallel between the two connection pads 42. Accordingly, a signal sent from one contact pad 42 to the other contact pad 42 (e.g., by the contact points 40 upon contacting the two contact pads 42) will pass through the capacitor 46 and the resistor 48, such that different electrical properties of the RFID strap 24 (namely, its capacitance and resistance) affect the electrical characteristics of the system 22.

In this illustrated embodiment, the capacitor 46 of the RFID strap 24 is connected in parallel with the inductor 36 when the connection points 40 are in contact with the contact pads 42, thereby defining a resonant circuit. In particular, energy is stored in a magnetic field arising from current flowing through the inductor 36 and in an electric field between the plates of the capacitor 46. The amount of energy stored in the inductor 36 depends on the current passing through the inductor 36, while the amount of energy stored in the capacitor 46 depends on the voltage across the capacitor 46. Current flowing through the inductor 36 decreases the voltage across the capacitor 46 until the energy stored in the capacitor 46 and the voltage across it is zero. The inductor 36 resists the change in the current and eventually reverses the direction in which the current flows between the inductor 36 and the capacitor 46, thereby building up the charge on one of the plates of the capacitor 46 (the plate opposing the one that was originally charged), which increases the voltage on the capacitor 46 and the energy stored in the capacitor 46. Eventually, the current flowing through the inductor 36 (and, hence, the energy stored in the magnetic field) is reduced to zero, with all of the energy being stored in the capacitor 46. The cycle repeats periodically at the resonant frequency of the resonant circuit until the loss of the resonant circuit (which is a function of the resistance/impedance of the resonant circuit) causes the cycle to end. The impedance of the RFID strap 24 may be a combination of the capacitance and an associated loss resistance.

The characteristics of the resonant circuit as an oscillator (e.g., the resonant frequency) depend at least in part on the capacitance and/or the resistance of the RFID strap 24. Accordingly, the characteristics of the resonant circuit (e.g., the amplitude as a function of time and/or the frequency of the signal emitted by the amplifier 26) may be monitored to determine the electrical characteristics of the RFID strap 24, such as its capacitance and/or resistance. One or more electrical characteristics of the RFID strap 24 may be compared either directly or indirectly (e.g., using the observed characteristics of the resonant circuit) to corresponding threshold values, with the strap 24 being considered to have passed the test if the observed electrical characteristic(s) of the strap 24 (or the resonant circuit) meet the threshold value(s) and being considered to have failed the test if not. The resonant circuit may have a relatively high resonant frequency (e.g., on the order of thousands to millions of times per second), such that the electrical characteristic or characteristics of the RFID strap 24 may be determined relatively quickly (e.g., on the order of one microsecond).

In one embodiment, that can be exemplified by FIG. 3, the amplifier 26 is initially provided in an inactive condition, with the amplifier 26 being turned on or changed to an active condition to test an associated RFID strap 24. In such an embodiment, broadband electrical noise at a low level is passed from the output side 30 of the amplifier 26 to the input side 28, with the broadband signal being filtered by the resonant circuit. At a frequency where the loss of the resonant circuit is less than the gain "G" of the amplifier 26 and the phase shift is zero, a signal at the resonant frequency circulates through the resonant circuit, with the amplitude of the signal increasing on each successive cycle. At a certain time, the amplitude of the output of the amplifier 26 reaches a limit and its gain "G" compresses until the loss and gain are equal, thereby establishing an equilibrium condition, with the resonant circuit operating as an oscillator at its resonant frequency. The number of cycles around the amplifier 26 and the resonant circuit required to reach the equilibrium condition is determined by the degree to which the amplifier gain "G" exceeds the loss and the delay through the amplifier 26 and the resonant circuit. As described above, this loss is related to the resistive loss of the resonant circuit, which loss is partially a function of the resistive loss of the RFID strap 24.

In an alternative embodiment, that can be exemplified by FIG. 3, the amplifier 26 is initially provided in an active condition and configured to operate at two frequencies, depending on whether an RFID strap 24 is connected in parallel to the inductor 36. When there is no RFID strap 24 connected in parallel to the inductor 36 (i.e., there is no resonant circuit in place), the amplifier 26 may function at a first frequency at which parasitic capacitance of the system 22 resonates with the inductance. When there is an RFID strap 24 connected in parallel to the inductor 36 (i.e., there is a resonant circuit in place), the amplifier 26 may function at a different frequency (e.g., the resonant frequency of the resonant circuit). In such an embodiment, a differential frequency (rather than an absolute frequency) may be monitored to determine one or more electrical characteristics of the RFID strap 24, thereby allowing fixed or variable offsets due to characteristics that may vary unpredictably (such as temperature drift of the value of the inductor 36).

It may be advantageous to control the voltage across the RFID strap 24, inasmuch as the strap 24 may include one or more components (e.g., diodes) with behavior that varies non-linearly with voltage. In other words, the measured parameters of the components (and, hence, the RFID strap 24) change, such that the voltage level applied to the RFID strap 24 is preferably maintained at a region or a point that is below where the component becomes non-linear (which region or point may be referred to as "sub threshold"). This may be achieved in any of a number of ways, such as by controlling the compression point of the amplifier 26 and, in the case of a system of the type illustrated in FIG. 3, of the coupling capacitors 32 and 34. In one particular embodiment, the capacitor 34 connected to the output side 30 of the amplifier 26 may be of a lower value than the capacitor 32 connected to the input side 28 of the amplifier 26. In yet another embodiment, additional elements, such as resistors, may be incorporated into the system 22 to help control the voltage across the RFID strap 24.

Figure 4:
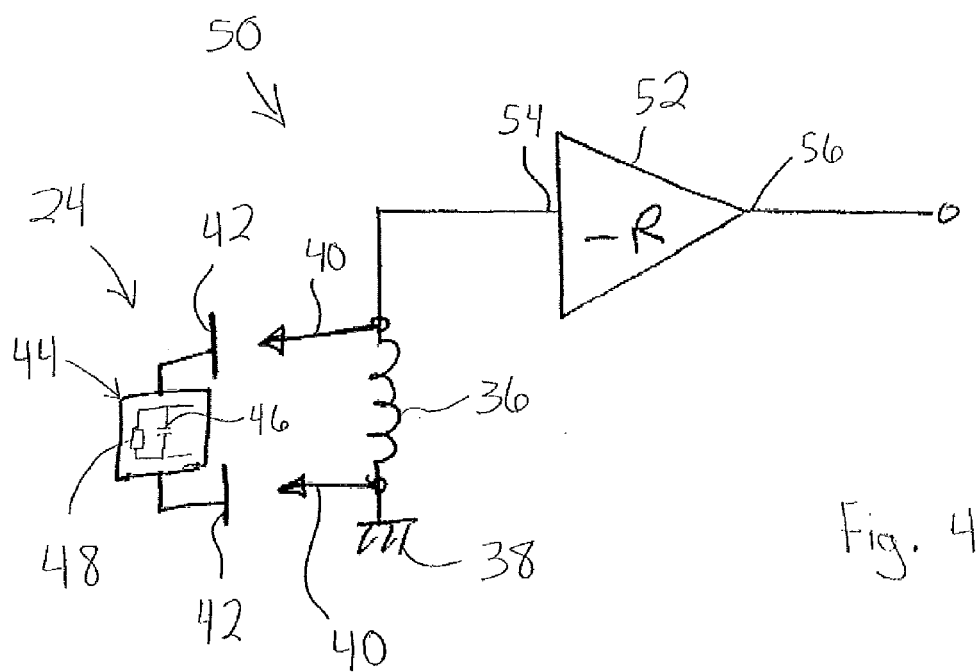
FIG. 4 is a diagrammatic view of a reflection amplifier-based system for testing an RFID strap.

FIG. 4 illustrates an embodiment of a reflection amplifier-based oscillation system 50 (comparable to the oscillator 16 of FIG. 2) for testing an RFID strap 24. The system 50 of FIG. 4 includes a reflection amplifier 52 having an input side 54 and an output side 56. The input side 54 of the amplifier 52 is electrically coupled in series to an inductor 36, which is grounded at 38. The inductor 36 may take any of a number of forms, such as being provided as a coil (such as a flat coil or in the form of a solenoid structure), a transmission line (e.g., a coaxial line, microstrip line, stripline, or coplanar waveguide), or a self-resonant structure operating at a frequency at which its net impedance is inductive (e.g., a crystal, surface acoustic wave device, or ceramic resonator).

The system 50 of FIG. 4 further includes a pair of connection points 40 electrically coupled to opposite ends of the inductor 36. The connection points 40 are configured to be placed into contact with a pair of contact pads 42 of an RFID strap 24, thereby placing the RFID strap 24 in parallel with the inductor 36. An RFID chip 44 is electrically coupled to the two contact pads 42, with FIG. 4 showing a simplified structure of an exemplary RFID chip 44. The RFID chip 44 of FIG. 4 includes a capacitor 46 and a resistor 48 connected in parallel between the two connection pads 42. Accordingly, a signal sent from one contact pad 42 to the other contact pad 42 (e.g., by the contact points 40 upon contacting the two contact pads 42) will pass through the capacitor 46 and the resistor 48, such that different electrical properties of the RFID strap 24 (namely, its capacitance and resistance) affect the electrical characteristics of the system 50.

The system 50 of FIG. 4 operates similarly to the system 22 of FIG. 3, except that the progressive increase of the amplitude of the output of the amplifier 52 may be considered as the signal periodically cycling back and forth between the resonant circuit (defined by the inductor 36 and the RFID strap 24, respectively) at the resonant frequency of the resonant circuit. In one embodiment of a system of the type illustrated in FIG. 4, the amplification may be provided by a device commonly known as a "negative resistor," which adds energy (essentially gain), with the resonant circuit absorbing energy into its resistive elements. As long as the energy added by the negative resistor per cycle exceeds the energy loss, the signal increases to saturation, as in the system 22 of FIG. 3. Similar to the embodiment of FIG. 3, the system 50 illustrated by FIG. 4 may be differently configured (e.g., with an amplifier 52 initially in either an active or inactive condition) without departing from the scope of the present disclosure.

Figure 5:
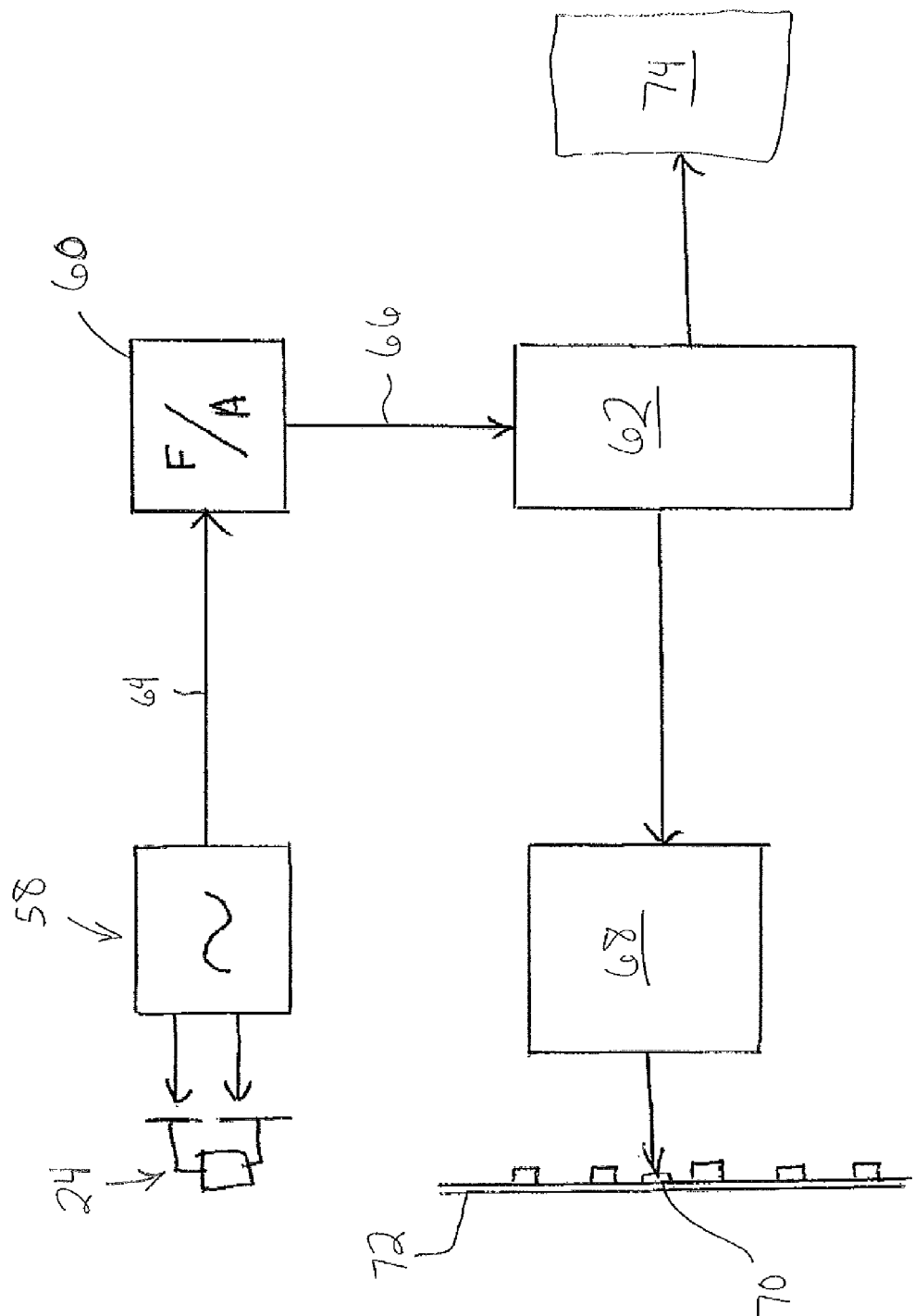
FIG. 5 is a diagrammatic view of a testing system incorporating a processor, a controller, and a strap marker or chip crusher.

The characteristics of the resonant circuit as an oscillator may be monitored using any of a number of suitable devices and methods. In one embodiment, which is illustrated in FIG. 5, the test system 58 (which may be of the type shown in FIG. 3 or in FIG. 4, for example) includes a measurement device or processor 60 and a controller 62. The processor 60 and the controller 62 may be variously configured, such as being provided as a frequency counter and a microprocessor (respectively), without departing from the scope of the present disclosure.

The signal 64 output by the test system 58 is received and processed by the processor 60 to determine one or more of its characteristics, such as its frequency and/or its amplitude as a function of time. If the amplifier of the test system 58 is configured to operate on two frequencies (as described above), the processor 60 will be able to register the decrease in amplitude of the signal 64, which is related to the resistance of the RFID strap 24 being tested. Alternatively, the small signal excess gain of the oscillator loop could be set so as to decrease to zero when the RFID strap's loss resistance component exceeds a designated "pass/fail" threshold; in this case, the oscillator output signal would decay to a nominal zero (background thermal noise floor) to indicate a strap to be marked as a failure (see below).

The information 66 derived from the signal 64 by the processor 60 is then passed to the controller 62, which may have one or more stored threshold values. The controller 62 compares the information 66 from the processor 60 to one or more of the threshold values to determine whether the characteristics of the resonant circuit as an oscillator (e.g., the amplitude of the output signal 64 as a function of time and/or the resonant frequency) meet the threshold value(s) or not. If the threshold value is, or the threshold values are, not met, then it is indicative of a defective or faulty RFID strap, whereas threshold value that is met indicates, or the threshold values that are met, indicate, that the RFID strap is functional and properly assembled.

A strap marker or chip crusher 68 may be associated with and controlled by the controller 62. When the controller 62 identifies a defective RFID strap 70, it instructs the strap marker or chip crusher 68 (or a portion or component thereof) to advance toward the defective RFID strap 70. Alternatively, the controller 62 may control the RFID strap 70 to be moved toward the strap marker or chip crusher 68 (e.g., by employing an electromagnet that pulls or pushes the web 72 on which the defective RFID strap 70 may be positioned toward the strap marker or chip crusher 68). If a strap marker is provided, then it will be brought into contact with the RFID strap 70 and then place a mark or symbol on the RFID strap 70 that designates the RFID strap 70 as defective or faulty or inoperative. If a chip crusher is provided, then it will be brought into contact with the RFID strap 70 to crush or destroy or otherwise disable an RFID chip of the RFID strap 70. If multiple RFID straps are being tested consecutively, the controller 62 may maintain a registry to ensure that the strap marker or chip crusher 68 acts upon only defective RFID straps, while allowing functional RFID straps to pass. The number of defective RFID straps may be recorded by the controller 62 and/or monitored by the controller 62 and reported to a host system 74 to assess the effectiveness of the chip-to-strap attachment system and initiate adjustments to the attachment system as needed.

Figure 6:
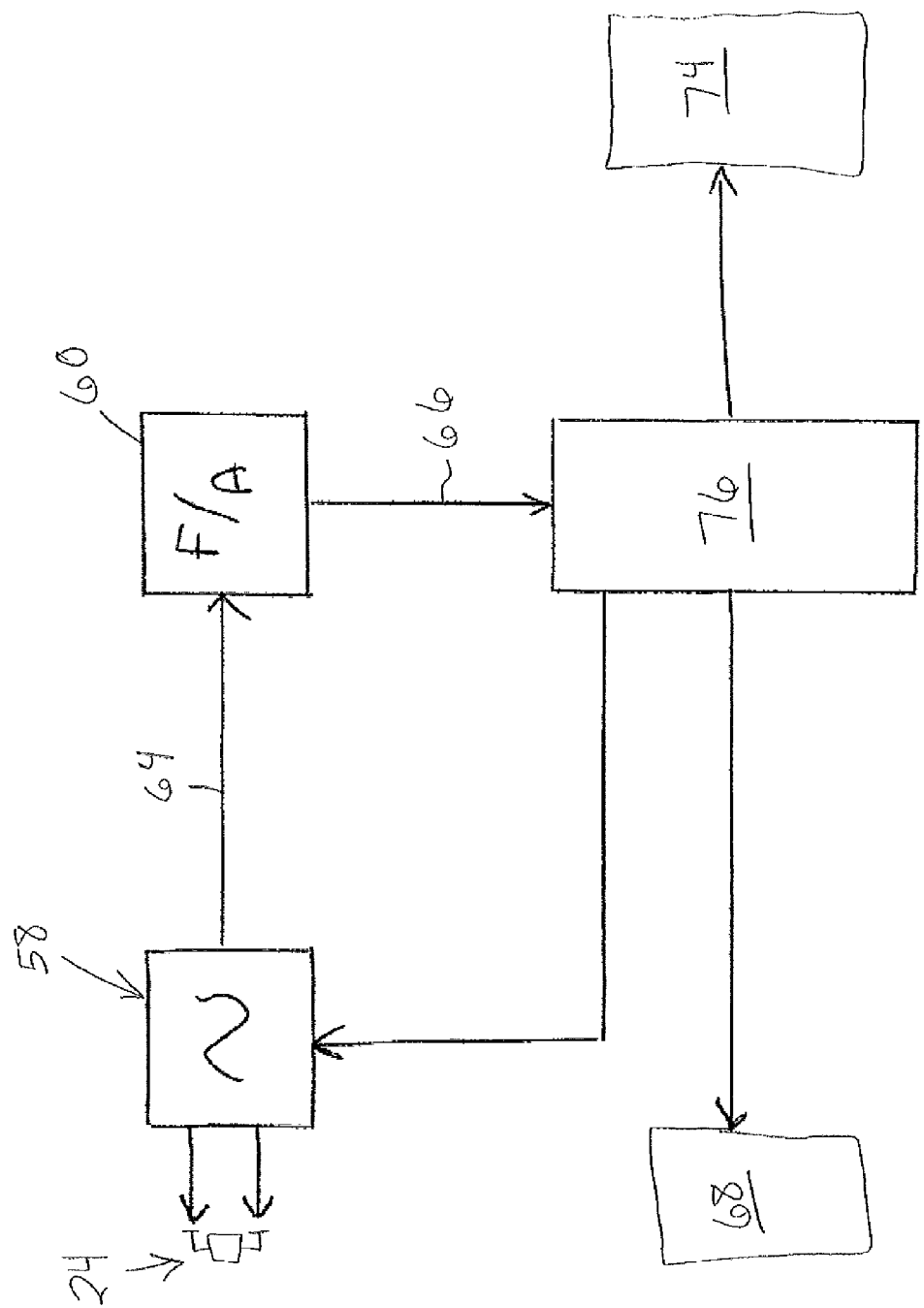
FIG. 6 is a diagrammatic view of a testing system incorporating a processor and a controller configured to communicate with an RFID strap.

FIG. 6 illustrates a system similar to the one of FIG. 5, but incorporating a controller 76 with additional functionality. In the embodiment of FIG. 6, the controller 76 is programmed to communicate with an RFID strap 24 either directly or via the associated test system 58. RFID devices typically receive communication from a reader system in the form of an amplitude modulated carrier signal and communicate back by modulating their input impedance to incoming unmodulated carrier signal. Oscillator-based test systems of the type described herein may communicate with an RFID chip of the strap 24 by stopping and starting the oscillation driven by a data modulation or by changing the effective compression point of the amplifier, thereby changing the signal applied to the RFID chip.

The latter approach may be preferred in that the resonant circuit is allowed to continue its oscillations. When the RFID chip modulates its input impedance, this may either stop the oscillations or change the operating frequency (depending on the design), both of which may be detected by the measurement device or processor 60. In this way, the host system 74 may establish two-way communication with the RFID chip, allowing data to read out of the RFID chip (e.g., a stored code or unique number), which allows the host system 74 to store measured data against the RFID chip information in a database and allows for data (e.g., the measurement device or processor data or a defined code) to be written into the RFID chip.

It will be understood that the embodiments described above are illustrative of some of the applications of the principles of the present subject matter. Numerous modifications may be made by those skilled in the art without departing from the spirit and scope of the claimed subject matter, including those combinations of features that are individually disclosed or claimed herein. For these reasons, the scope hereof is not limited to the above description but is as set forth in the following claims, and it is understood that claims may be directed to the features hereof, including as combinations of features that are individually disclosed or claimed herein.

The invention claimed is:

1. A system for testing an RFID strap of the type having a pair of contact pads, comprising:
   an amplifier;
   an inductive component electrically coupled to the amplifier; and
   a pair of contact points configured to be placed in contact with a pair of contact pads of an RFID strap so as to place the RFID strap in parallel with the inductive component to define a resonant circuit and the amplifier is configured to operate on a first frequency when there is no RFID strap in parallel with the inductive component and on a second frequency when an RFID strap is connected in parallel with the inductor; wherein the characteristics of the resonant circuit as an oscillator depend at least in part on the capacitance and the resistance of the RFID strap, such that the characteristics of the resonant circuit as an oscillator may be monitored to determine the capacitance and/or the resistance of the RFID strap.

2. The system of claim 1, wherein the amplifier comprises a transmission amplifier having an input side and an output side each electrically coupled to the inductive component by a capacitor.

3. The system of claim 1, wherein the amplifier comprises a reflectance amplifier connected in series to the inductive component.

4. The system of claim 1, further comprising a processor configured to measure the amplitude as a function of time and/or the frequency of the output of the amplifier to monitor the characteristics of the resonant circuit as an oscillator.

5. The system of claim 1, further comprising a controller configured to compare the characteristics of the resonant circuit as an oscillator to one or more threshold values and, if the characteristics of the resonant circuit as an oscillator do not meet the threshold values, determine that the RFID strap is defective.

6. The system of claim 5, further comprising a strap marker, wherein the controller is configured to command the strap marker to mark the RFID strap as defective if the controller determines that the RFID strap is defective.

7. The system of claim 5, further comprising a chip crusher, wherein the controller is configured to command the chip crusher to disable the RFID strap if the controller determines that the RFID strap is defective.

8. The system of claim 5, wherein the controller is programmed to communicate with the RFID strap and to vary a signal transmitted to the RFID strap.

9. The system of claim 1, wherein the amplifier is provided in an inactive condition.

10. The system of claim 9, wherein the amplifier is configured to be changed to an active condition when testing an RFID strap.

11. The system of claim 1, wherein the amplifier is provided in an active condition.

12. A method of testing an RFID strap, comprising:
   providing an amplifier electrically coupled to an inductor said providing an amplifier in an inactive condition,
   connecting an RFID strap in parallel with the inductor to define a resonant circuit and changing the amplifier to an active condition;
   causing energy to oscillate between the inductor and the RFID strap at the resonant frequency of the resonant circuit; and
   monitoring the characteristics of the resonant circuit as an oscillator to determine the capacitance and/or the resistance of the RFID strap.

13. The method of claim 12, wherein said providing an amplifier electrically coupled to an inductor includes providing a transmission amplifier having an input side and an output side each electrically coupled to the inductor by a capacitor.

14. The method of claim 12, wherein said providing an amplifier electrically coupled to an inductor includes providing a reflectance amplifier connected in series to the inductor.

15. The method of claim 12, wherein said monitoring the characteristics of the resonant circuit as an oscillator includes measuring the amplitude as a function of time and/or the frequency of the output of the amplifier to monitor the characteristics of the resonant circuit as an oscillator.

16. The method of claim 12, wherein said monitoring the characteristics of the resonant circuit includes comparing the characteristics of the resonant circuit as an oscillator to one or more threshold values and, if the characteristics of the resonant circuit as an oscillator do not meet the threshold values, marking the RFID strap as defective or disabling the RFID strap.

* * * * *